(12) United States Patent
Kim

(10) Patent No.: US 11,410,955 B2
(45) Date of Patent: Aug. 9, 2022

(54) SEMICONDUCTOR MEMORY DEVICE

(71) Applicant: SK hynix Inc., Icheon-si (KR)

(72) Inventor: Jin Ha Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 235 days.

(21) Appl. No.: 16/846,927

(22) Filed: Apr. 13, 2020

(65) Prior Publication Data

US 2021/0151404 A1    May 20, 2021

(30) Foreign Application Priority Data

Nov. 19, 2019  (KR) .......................... 10-2019-0149041

(51) Int. Cl.
*H01L 25/065*  (2006.01)
*H01L 25/18*  (2006.01)
*H01L 23/00*  (2006.01)

(52) U.S. Cl.
CPC .......... *H01L 24/16* (2013.01); *H01L 25/0657* (2013.01); *H01L 25/18* (2013.01); *H01L 2224/0807* (2013.01); *H01L 2224/08145* (2013.01); *H01L 2225/06524* (2013.01); *H01L 2924/1431* (2013.01); *H01L 2924/1434* (2013.01)

(58) Field of Classification Search
CPC ......... H01L 25/0657; H01L 2224/0807; H01L 24/16; H01L 2224/08145; H01L 2225/06524; H01L 2924/1431; H01L 2924/1434; H01L 27/11573; H01L 2224/80365; H01L 24/08; H01L 23/525; H01L 25/18

See application file for complete search history.

(56) References Cited

U.S. PATENT DOCUMENTS

| 2011/0008632 | A1  | 1/2011 | Zheng et al. |
| 2020/0258817 | A1* | 8/2020 | Okina ................ H01L 25/0657 |
| 2021/0074717 | A1* | 3/2021 | Lim ................ H01L 27/11582 |

FOREIGN PATENT DOCUMENTS

KR        100725364 B1    6/2007

* cited by examiner

*Primary Examiner* — Thanh Y. Tran
(74) *Attorney, Agent, or Firm* — William Park & Associates Ltd.

(57) ABSTRACT

A semiconductor memory device includes a first chip having a peripheral transistor and a first insulating layer, and includes a second chip having a stacked structure and a second insulating layer. The stacked structure includes conductive patterns and insulating patterns alternately stacked with each other, the first insulating layer includes a first bonding surface, the second insulating layer includes a second bonding surface contacting the first bonding surface, and the second chip further includes a protrusion protruding from the second bonding surface of the second insulating layer toward the first insulating layer.

16 Claims, 8 Drawing Sheets

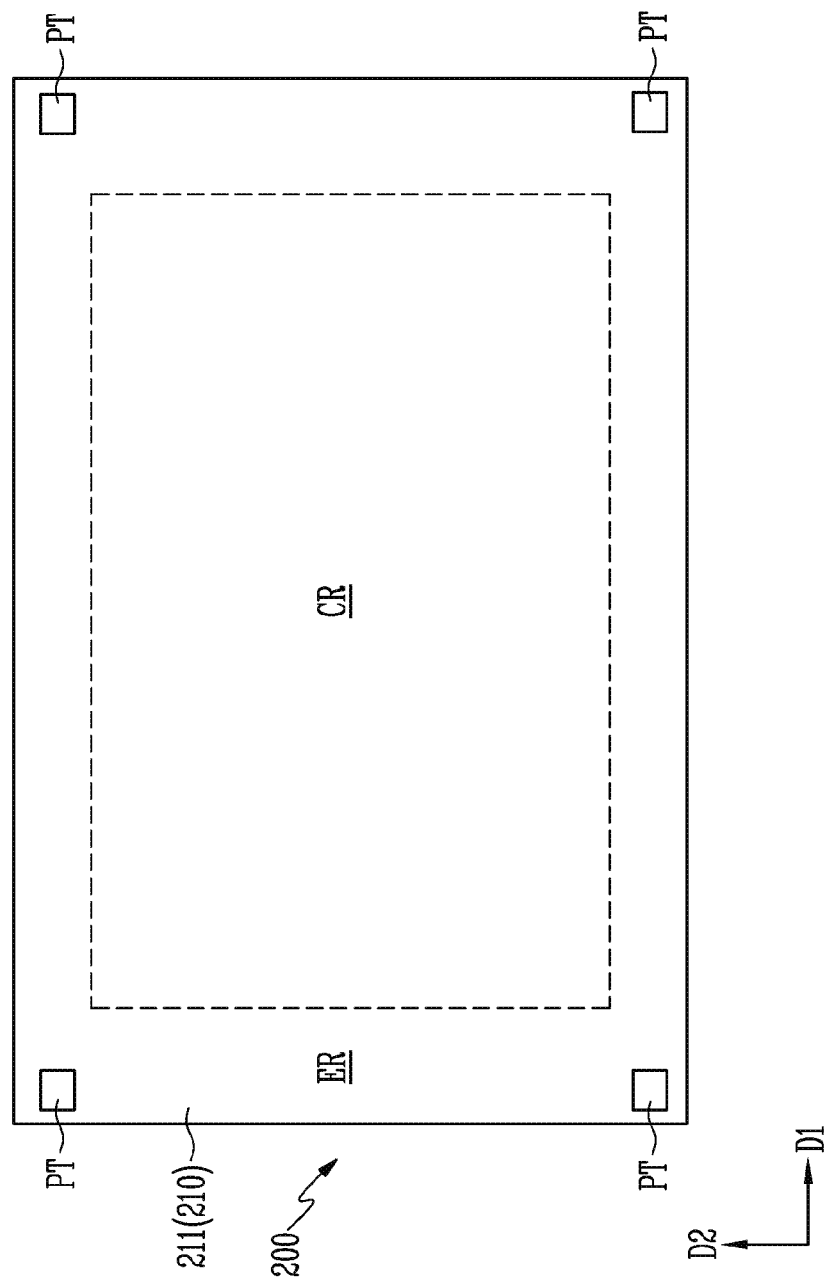

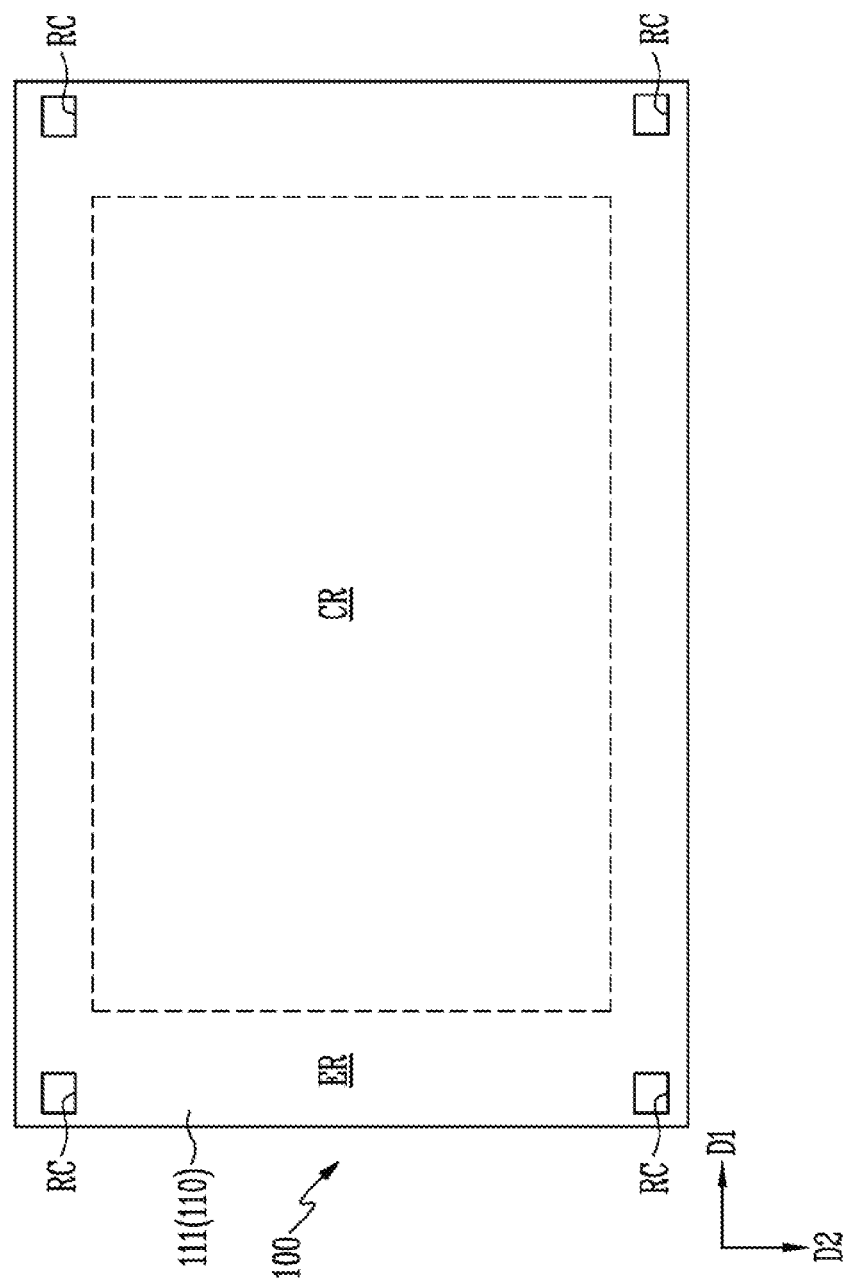

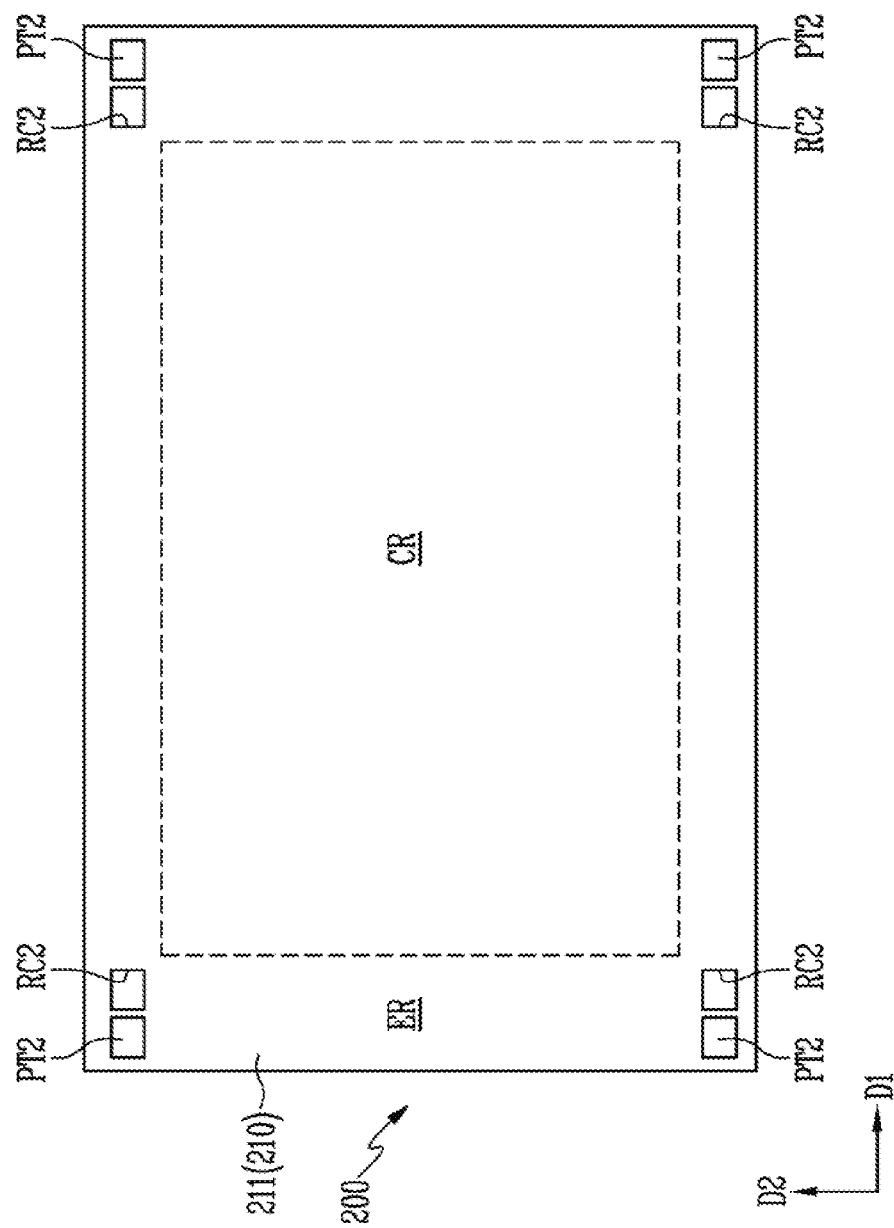

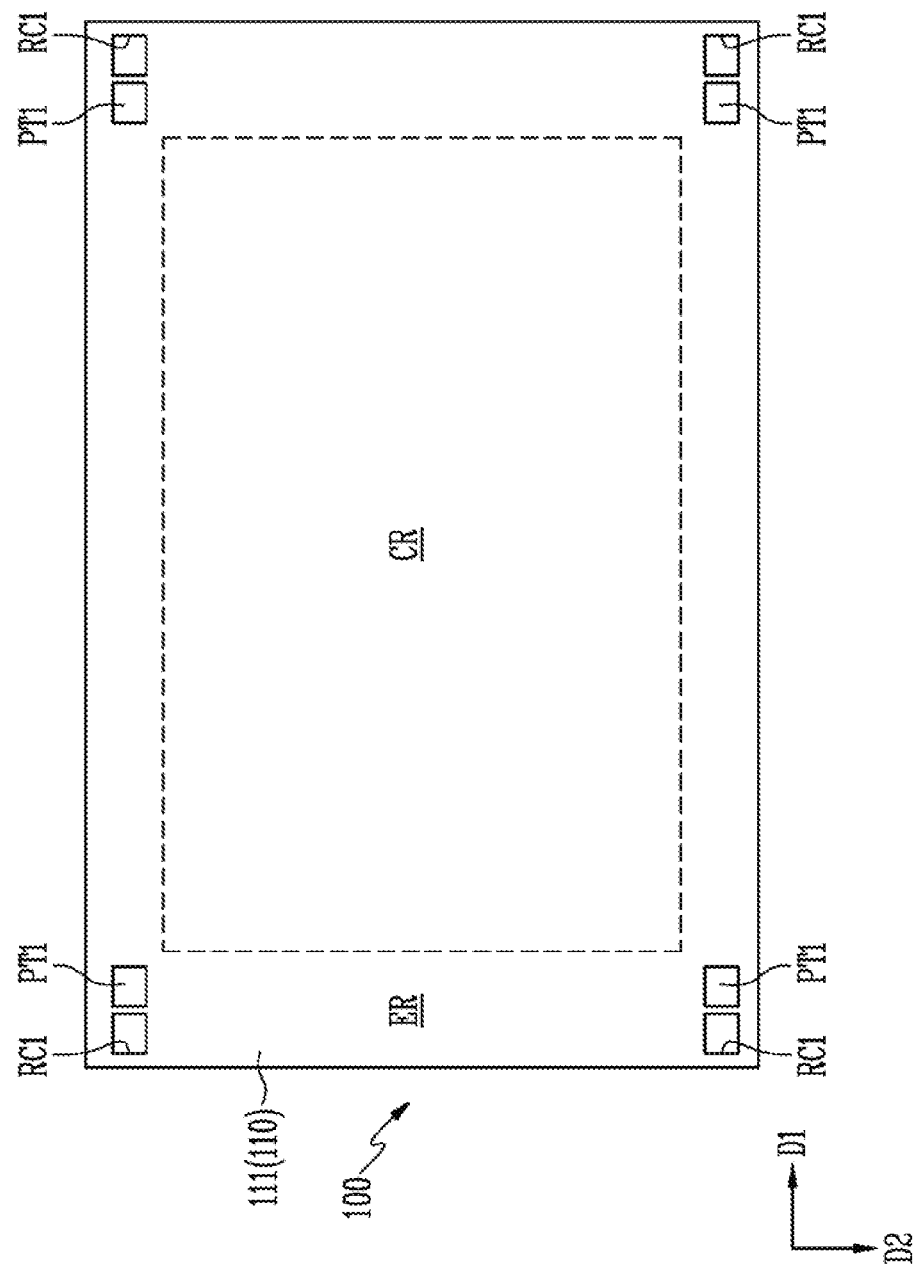

SEMICONDUCTOR MEMORY DEVICE

CROSS-REFERENCE TO RELATED APPLICATION

The present application claims priority under 35 U.S.C. § 119(a) to Korean patent application number 10-2019-0149041 filed on Nov. 19, 2019, the entire disclosure of which is incorporated herein by reference.

BACKGROUND

1. Technical Field

Various embodiments relate generally to a semiconductor memory device, and more particularly, to a three-dimensional semiconductor memory device.

2. Related Art

Semiconductor memory devices may include memory cells capable of storing data.

Depending on data storage and maintenance methods, semiconductor memory devices may be divided into volatile semiconductor memory devices and non-volatile semiconductor memory devices. Volatile memory devices may lose data when a power supply is interrupted, whereas non-volatile memory devices can retain stored data even in the absence of supplied power.

Recently, with the increased use of portable electronic devices, the use of non-volatile semiconductor memory devices has increased. For portability and capacity, highly integrated semiconductor memory devices are being sought. Three-dimensional semiconductor memory devices have been proposed to increase an integration density.

SUMMARY

According to an embodiment, a semiconductor memory device may include a first chip including a peripheral transistor and a first insulating layer. The semiconductor memory device may further include a second chip including a stacked structure and a second insulating layer. The stacked structure includes conductive patterns and insulating patterns alternately stacked with each other, the first insulating layer includes a first bonding surface, the second insulating layer includes a second bonding surface contacting the first bonding surface, and the second chip further includes a protrusion protruding from the second bonding surface of the second insulating layer toward the first insulating layer.

According to an embodiment, a semiconductor memory device may include a first chip including a peripheral transistor and a first insulating layer. The semiconductor memory device may also include a second chip including a stacked structure and a second insulating layer. The stacked structure includes conductive patterns and insulating patterns alternately stacked with each other, the first insulating layer includes a first bonding surface, the second insulating layer includes a second bonding surface contacting the first bonding surface, and the first chip further includes a protrusion protruding from the first bonding surface of the first insulating layer toward the second insulating layer.

According to an embodiment, a semiconductor memory device may include a first chip including a peripheral transistor and a first insulating layer. The semiconductor memory device may also include a second chip including a stacked structure and a second insulating layer. The stacked structure includes conductive patterns and insulating patterns alternately stacked with each other, wherein the first insulating layer includes a first bonding surface, wherein the second insulating layer includes a second bonding surface contacting the first bonding surface, wherein the first chip further includes a first protrusion protruding from the first bonding surface of the first insulating layer toward the second insulating layer, and wherein the second chip further includes a second protrusion protruding from the second bonding surface of the second insulating layer toward the first insulating layer.

BRIEF DESCRIPTION OF THE DRAWINGS

FIG. 1B is a schematic plan view illustrating a lower surface of a second chip of FIG. 1A;

FIG. 1C is a schematic plan view illustrating an upper surface of a first chip of FIG. 1A;

FIG. 3B is a schematic plan view illustrating a lower surface of a second chip of FIG. 3A;

FIG. 3C is a schematic plan view illustrating an upper surface of a first chip of FIG. 3A;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments of the present disclosure provide a semiconductor memory device capable of improving operational reliability.

Figure 1A:
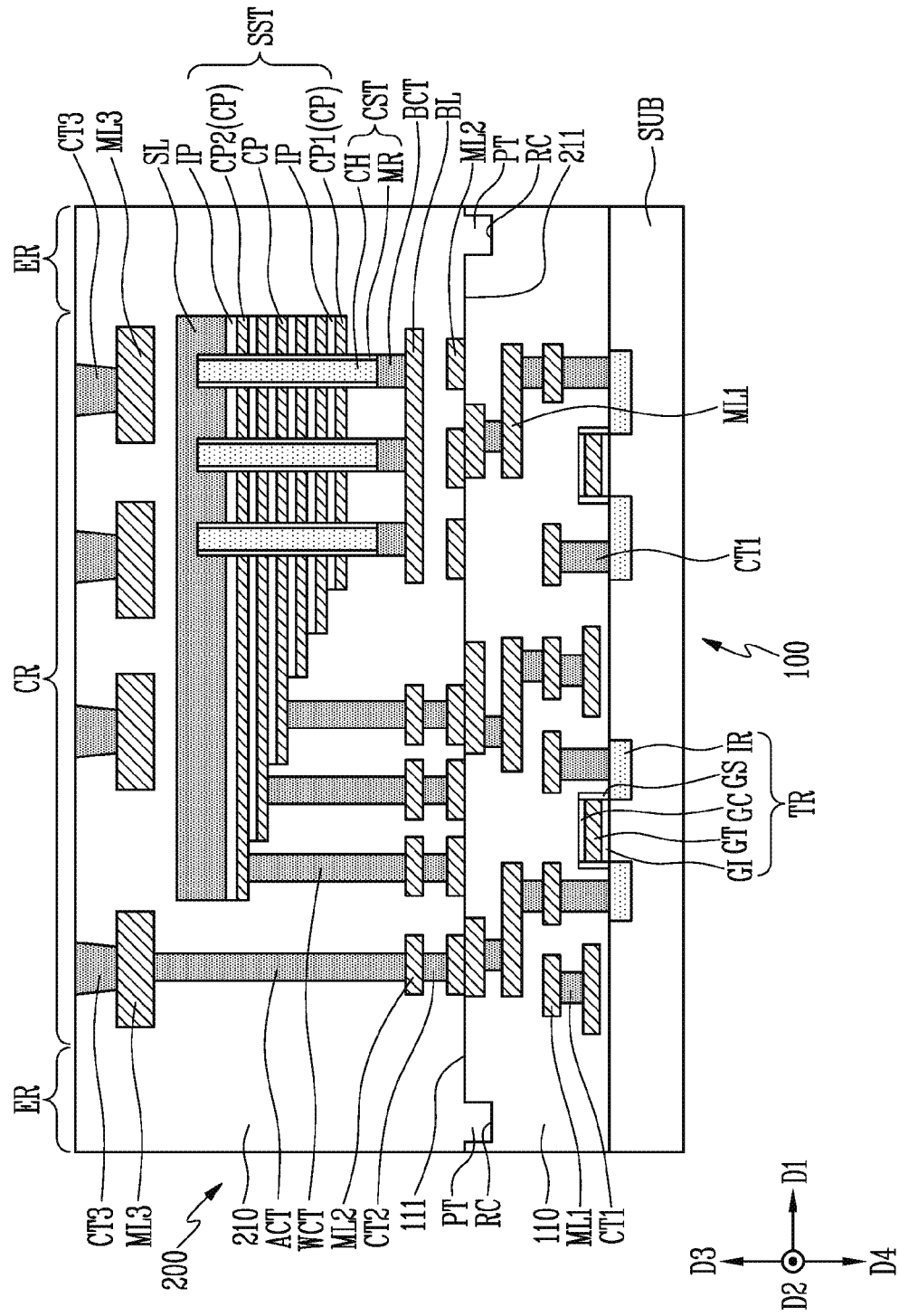
FIG. 1A is a cross-sectional view of a semiconductor memory device according to an embodiment of the present disclosure.

FIG. 1A is a cross-sectional view of a semiconductor memory device according to an embodiment of the present disclosure. FIG. 1B is a schematic plan view illustrating a lower surface of a second chip of FIG. 1A. FIG. 1C is a schematic plan view illustrating an upper surface of a first chip of FIG. 1A.

Referring to FIGS. 1A to 1C, according to an embodiment of the present disclosure, a semiconductor memory device may include a first chip 100 and a second chip 200. The second chip 200 may be provided on the first chip 100. As shown in FIGS. 1A to 1C, according to this embodiment, the second chip 200 may be provided over the first chip 100. However, contrary to FIGS. 1A to 1C, according to another embodiment, the first chip 100 may be provided over the second chip 200.

The first chip 100 may include a substrate SUB, a first insulating layer 110, first contacts CT1, first metal lines ML1, and peripheral transistors TR.

The substrate SUB may have a shape of a plate extending along a plane defined in a first direction D1 and a second direction D2. The substrate SUB may be a single-crystal semiconductor device. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The first insulating layer 110 may cover an upper surface of the substrate SUB. For example, the first insulating layer 110 may include an oxide or a nitride. The first insulating layer 110 may include a first bonding surface 111. The first bonding surface 111 may contact a second bonding surface 211 to be described below.

The peripheral transistors TR may be provided between the substrate SUB and the first insulating layer 110. Each of the peripheral transistors TR may include impurity regions IR, gate spacers GS, a gate capping layer GC, a gate pattern GT, and a gate insulating layer GI. The peripheral transistor TR may be an NMOS transistor or a PMOS transistor.

The impurity regions IR may be a portion of the substrate SUB. The impurity regions IR may be formed by doping the substrate SUB with impurities.

The gate spacers GS may be provided on the substrate SUB. The gate spacers GS may be separated from each other in the first direction D1. For example, the gate spacers GS may include a silicon oxide.

The gate insulating layer GI, the gate pattern GT, and the gate capping layer GC may be provided between the gate spacers GS. The gate insulating layer GI may be formed on the substrate SUB, the gate pattern GT may be formed on the gate insulating layer GI, and the gate capping layer GC may be formed on the gate pattern GT. For example, the gate insulating layer GI may include a silicon oxide. The gate pattern GT may include a conductive material. For example, the gate pattern GT may include metal or a conductive semiconductor material. For example, the gate capping layer GC may include a silicon oxide.

However, in another embodiment, a register and a capacitor may be further provided in the first insulating layer 110. The peripheral transistors TR, the register, and the capacitor may be used as elements constituting a row decoder, a column decoder, a page buffer circuit, and an input/output circuit.

The substrate SUB may further include an isolation layer that divides an active region in which the peripheral transistor TR is disposed.

The first contacts CT1 and the first metal lines ML1 may be provided in the first insulating layer 110. Some of the first contacts CT1 may be coupled to the peripheral transistors TR. Some of the first contacts CT1 may couple the first metal lines ML1 to each other. The first metal lines ML1 may be coupled to the first contacts CT1. Some of the first metal lines ML1 may be exposed through the first bonding surface 111 of the first insulating layer 110. Upper surfaces of some of the first metal lines ML1 may be located at the same level as the first bonding surface 111 of the first insulating layer 110. The first metal lines ML1 may be electrically coupled to the peripheral transistors TR. Other first metal lines ML1 may contact the second bonding surface 211 of a second insulating layer 210 to be described below. For example, the first contacts CT1 and the first metal lines ML1 may include tungsten, aluminum, or copper.

The second chip 200 may include a source layer SL, a stacked structure SST, the second insulating layer 210, channel structures CST, bit line contacts BCT, a bit line BL, word line contacts WCT, an array contact ACT, second contacts CT2, second metal lines ML2, third contacts CT3, and third metal lines ML3.

The second insulating layer 210 may contact the first insulating layer 110 of the first chip 100. The second insulating layer 210 may include the second bonding surface 211. The second bonding surface 211 of the second insulating layer 210 may contact the first bonding surface 111 of the first insulating layer 110. The second insulating layer 210 may include an oxide or a nitride.

The source layer SL may be provided in the second insulating layer 210. The source layer SL may have a shape of a plate extending along a plane defined in the first direction D1 and the second direction D2. The source layer SL may include a conductive material. For example, the source layer SL may include doped polysilicon.

The stacked structure SST may be provided in the second insulating layer 210. The stacked structure SST may contact the source layer SL. The stacked structure SST may include conductive patterns CP and insulating patterns IP stacked alternately with each other in a third direction D3. The third direction D3 may be perpendicular to the first direction D1 and the second direction D2.

The conductive pattern CP located closest to the first chip 100, among the conductive patterns CP, may be defined as a first conductive pattern CP1. The conductive pattern CP located farthest from the first chip 100, among the conductive patterns CP, may be defined as a second conductive pattern CP2. The first conductive pattern CP1 may be located adjacent to the first chip 100 more than the second conductive pattern CP2. A length of the first conductive pattern CP1 in the first direction D1 may be less than that of the second conductive pattern CP2 in the first direction D1. The first conductive pattern CP1 may be the shortest in the first direction D1 among the conductive patterns CP. The second conductive pattern CP2 may be the longest in the first direction D1 among the conductive patterns CP. The conductive patterns CP may become shorter in the first direction D1 toward the first chip 100.

The conductive patterns CP may include a gate conductive layer. For example, the gate conductive layer may include at least one of a doped silicon layer, a metal silicide layer, tungsten, nickel, and cobalt, and may serve as a word line coupled to a memory cell, or a select line coupled to a select transistor. The conductive patterns CP may further include a gate barrier layer surrounding the gate conductive layer. For example, the gate barrier layer may include at least one of a titanium nitride and a tantalum nitride. For example, the insulating patterns IP may include a silicon oxide.

The channel structures CST may be provided in the second insulating layer 210. The channel structures CST may pass through the stacked structure SST. The channel structures CST may extend in the third direction D3. A top portion of the channel structure CST may be located in the source layer SL.

Each of the channel structures CST may include a channel layer CH and a memory layer MR. The memory layer MR may surround an outer wall of the channel layer CH.

For example, the channel layer CH may include doped polysilicon or undoped polysilicon. The memory layer MR may include a tunnel layer contacting the channel layer CH, a storage layer surrounding the tunnel layer, and a blocking layer surrounding the storage layer. The tunnel layer may include a material enabling charge tunneling. The storage layer may include a material in which charges are trapped. The blocking layer may include a material blocking charge movements.

As shown in FIGS. 1A to 1C, according to an embodiment, the channel layer CH may have a pillar shape. However, contrary to FIGS. 1A to 1C, according to another embodiment, the channel layer CH may have a cylindrical shape, and a filling insulating layer (not shown) may be provided in the channel layer CH.

Each of the bit line contacts BCT may be coupled to each of the channel structures CST. The bit line contacts BCT may be provided in the second insulating layer 210. The bit line contacts BCT may include a conductive material. For example, the bit line contacts BCT may include tungsten, aluminum, or copper.

The bit line BL may be coupled to the bit line contacts BCT. The bit line BL may be provided in the second insulating layer 210. The bit line BL may extend in the first direction D1. The bit line BL may include a conductive material. For example, the bit line BL may include tungsten, aluminum, or copper.

Each of the word line contacts WCT may be coupled to each of the conductive patterns CP. The word line contacts WCT may be provided in the second insulating layer 210. The word line contacts WCT may extend in the third direction D3. The word line contacts WCT may include a conductive material. For example, the word line contacts WCT may include tungsten, aluminum, or copper.

The second metal lines ML2 may be provided in the second insulating layer 210. The second metal lines ML2 may be provided under the stacked structure SST. The second metal lines ML2 may be provided between the stacked structure SST and the first insulating layer 110. Some of the second metal lines ML2 may be coupled to the word line contacts WCT. Some of the second metal lines ML2 may be exposed through the second bonding surface 211 of the second insulating layer 210. Lower surfaces of some of the second metal lines ML2 may be located at the same level as the second bonding surface 211 of the second insulating layer 210. The second metal lines ML2 may be coupled to the second contacts CT2. Other second metal lines ML2 may contact the first bonding surface 111 of the first insulating layer 110 to be described below. Some of the second metal lines ML2 may contact the first metal lines ML1. The second metal lines ML2 may be electrically coupled to the conductive pattern CP of the stacked structure SST. The second metal lines ML2 may include a conductive material. For example, the second metal lines ML2 may include tungsten, aluminum, or copper.

Some of the second contacts CT2 may couple the second metal lines ML2 to each other. The second contacts CT2 may be provided in the second insulating layer 210. The second contacts CT2 may include a conductive material. For example, the second contacts CT2 may include tungsten, aluminum, or copper.

The third metal lines ML3 may be provided in the second insulating layer 210. The third metal lines ML3 may be provided above the stacked structure SST. The third metal lines ML3 may include a conductive material. For example, the third metal lines ML3 may include tungsten, aluminum, or copper.

Each of the third contacts CT3 may be coupled to each of the third metal lines ML3. The third contacts CT3 may be provided in the second insulating layer 210. The third metal lines ML3 may be electrically coupled to an external circuit through the third contacts CT3. The third contacts CT3 may include a conductive material. For example, the third contacts CT3 may include tungsten, aluminum, or copper.

The array contact ACT may be provided in the second insulating layer 210. The array contact ACT may couple the second metal wires ML2 to the third metal lines ML3. The array contact ACT may extend in the third direction D3. The array contact ACT may include a conductive material. For example, the array contact ACT may include tungsten, aluminum, or copper. An electrical signal from the external circuit may be transferred to the peripheral transistor TR through the array contact ACT.

Referring to FIGS. 1A and 1B, the second chip 200 may be divided into a central region CR and an edge area ER. The edge area ER may surround the central region CR in two dimensions. In a plan view, the source layer SL, the stacked structure SST, the channel structures CST, the bit line contacts BCT, the bit line BL, the word line contacts WCT, the second metal lines ML2, the second contacts CT2, the third metal lines ML3, the third contacts CT3, and the array contact ACT of the second chip 200 may be arranged in the central area CR of the second chip 200.

The second chip 200 may further include protrusions PT protruding from the second bonding surface 211 in a fourth direction D4. The fourth direction D4 may be opposite to the third direction D3. The protrusions PT may protrude from the second bonding surface 211 of the second insulating layer 210 toward the first insulating layer 110 of the first chip 100. In a plan view, the protrusions PT may be arranged in the edge area ER of the second chip 200. The protrusions PT may be formed integrally with the second insulating layer 210. In other words, the protrusions PT may be coupled to the second insulating layer 210 without boundaries therebetween. The protrusions PT may be inserted into the first insulating layer 110 of the first chip 100. For example, the protrusions PT may include an oxide or a nitride. The shapes of the protrusions PT are illustrated as cubic. However, other embodiments are not limited to cubic-shaped protrusions.

In an embodiment, the second chip 200 may include four protrusions PT. A distance between two protrusions PT spaced apart from each other in the first direction D1 may be greater than a width of the central region CR of the second chip 200 in the first direction D1. A distance between the other two protrusions PT spaced apart from each other in the second direction D2 may be greater than a width of the central region CR of the second chip 200 in the second direction D2. An area of a plane defined by coupling the four protrusions PT may be larger than a planar area of the central region CR of the second chip 200. In two dimensions, the stacked structure SST may be arranged between the protrusions PT.

Referring to FIGS. 1A and 1C, the first chip 100 may be divided into the central region CR and the edge area ER. In two dimensions, the edge area ER may surround the central region CR. In a plan view, the peripheral transistors TR, the first metal lines ML1 and the first contacts CT1 of the first chip 100 may be arranged in the central region CR of the first chip 100.

The first chip 100 may further include recesses RC defined by the first insulating layer 110. The first bonding surface 111 of the first insulating layer 110 may be depressed in a fourth direction D4 to form the recesses RC. In two dimensions, the recesses RC may be arranged in the edge area ER of the first chip 100.

Each of the recesses RC may correspond to a protrusion PT. In other words, each of the protrusions PT may be inserted into a different recesses RC. Each of the recesses RC may overlap with a corresponding one of the protrusions PT in the third direction D3. A two-dimensional area of the recess RC may be the same as that of the protrusion PT corresponding thereto. A shape of the recess RC may be the same as that of the protrusion PT corresponding thereto.

For example, the first chip 100 may include four recesses RC. A distance between two recesses RC spaced apart from each other in the first direction D1 may be greater than a width of the central region CR of the first chip 100 in the first direction D1. A distance between two recesses RC spaced apart from each other in the second direction D2 may be greater than a width of the central region CR of the first chip 100 in the second direction D2. An area of a plane defined by coupling the four recesses RC may be smaller than a planar area of the central region CR of the first chip 100. In a plan view, the peripheral transistors TR may be arranged between the recesses RC.

In a semiconductor memory device according to an embodiment, when the first chip 100 and the second chip 200 are bonded to each other, the protrusions PT of the second chip 200 may be inserted into the recesses RC of the first chip 100. Accordingly, bonding strength between the first chip 100 and the second chip 200 may be increased. In particular, the first chip 100 and the second chip 200 bonded to each other may have relatively good durability against a force exerted in the first direction D1.

Figure 2:
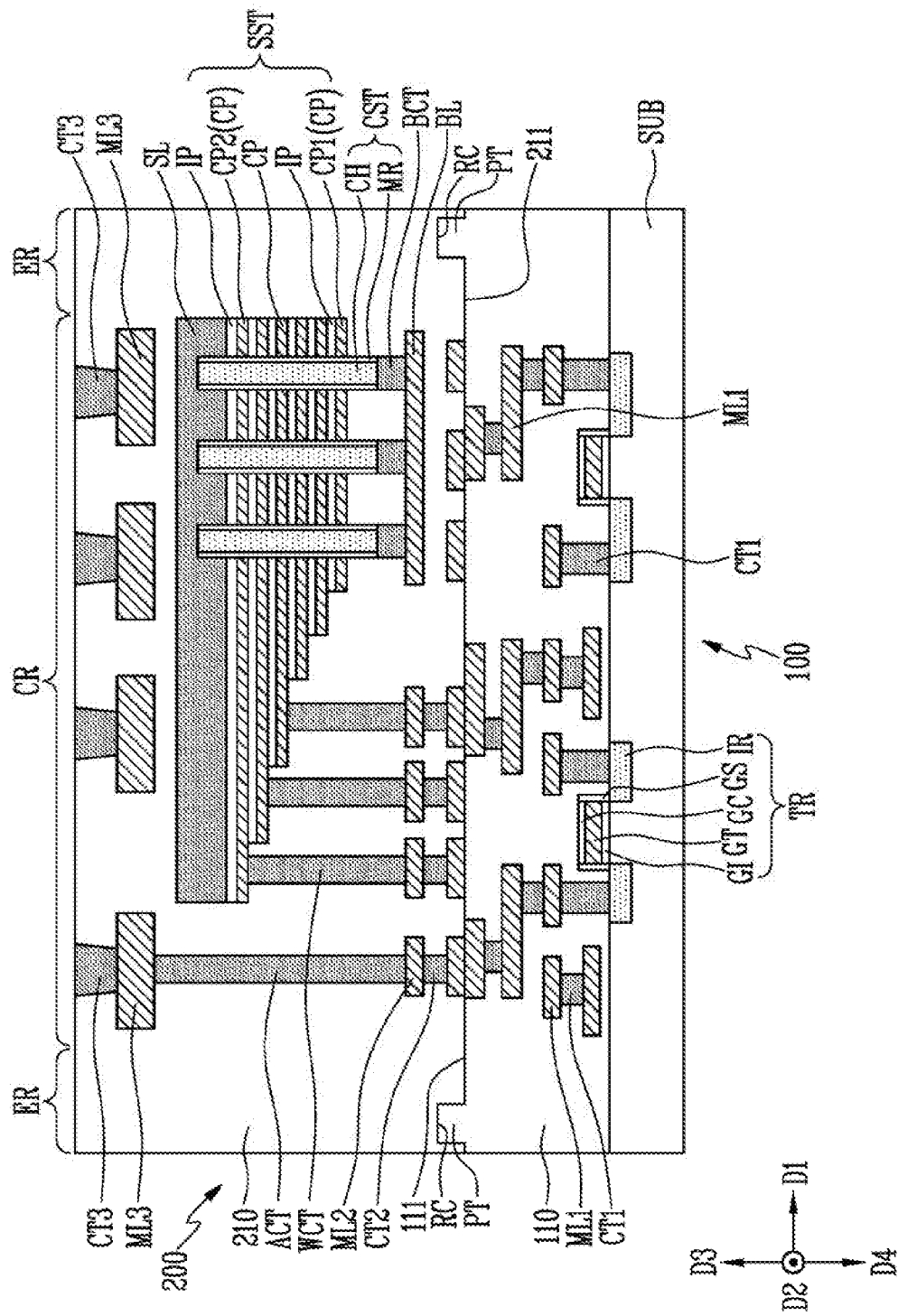
FIG. 2 is a cross-sectional view of a semiconductor memory device according to another embodiment of the present disclosure.

FIG. 2 is a cross-sectional view of a semiconductor memory device according to another embodiment of the present disclosure. A semiconductor memory device according to this embodiment may be similar to the semiconductor memory device as described above with reference to FIGS. 1A to 1C except for differences to be described below.

Referring to FIG. 2, in the semiconductor memory device according to this embodiment, the first chip 100 may include the protrusions PT that protrude from the first bonding surface 111 of the first insulating layer 110 of the first chip 100 in the third direction D3. The protrusion PT may protrude from the first bonding surface 111 of the first insulating layer 110 toward the second insulating layer 210 of the second chip 200. In a plan view, the protrusions PT may be arranged in the edge area ER of the first chip 100. The protrusions PT may be formed integrally with the first insulating layer 110. In other words, the protrusions PT may be coupled to the first insulating layer 110 without boundaries therebetween. The protrusions PT may be inserted into the second insulating layer 210 of the second chip 200.

The second chip 200 may further include the recesses RC defined by the second insulating layer 210. The second bonding surface 211 of the second insulating layer 210 may be depressed in the third direction D3 to form the recesses RC. In two dimensions, the recesses RC may be arranged in the edge area ER of the second chip 200.

Each of the recesses RC may correspond to a different one of the protrusions PT. When the first chip 100 and the second chip 200 are bonded to each other, the protrusions PT of the first chip 100 may be inserted into the recesses RC of the second chip 200.

Figure 3A:
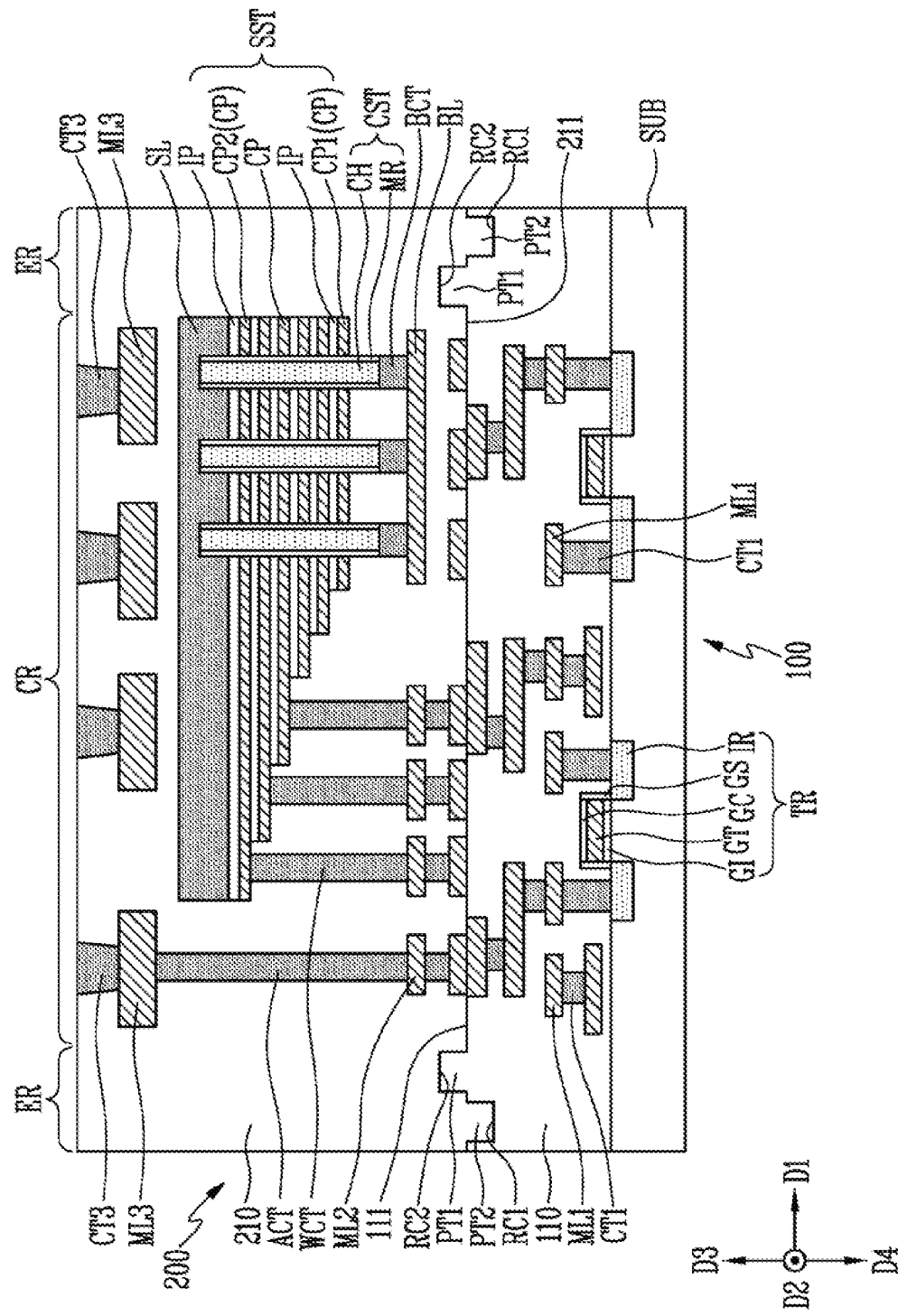
FIG. 3A is a cross-sectional view of a semiconductor memory device according to another embodiment of the present disclosure.

FIG. 3A is a cross-sectional view of a semiconductor memory device according to another embodiment of the present disclosure. FIG. 3B is a schematic plan view illustrating a lower surface of the second chip 200 of FIG. 3A. FIG. 3C is a schematic plan view illustrating an upper surface of the first chip 100 of FIG. 3A. A semiconductor memory device according to this embodiment may be similar to the semiconductor memory device as described above with reference to FIGS. 1A to 1C except for differences to be described below.

Referring to FIGS. 3A to 3C, the first chip 100 of the semiconductor memory device according to this embodiment may include first protrusions PT1 and first recesses RC1.

The first protrusions PT1 may protrude from the first bonding surface 111 of the first insulating layer 110 of the first chip 100 in the third direction D3. The first protrusions PT1 may protrude from the first bonding surface 111 of the first insulating layer 110 toward the second insulating layer 210 of the second chip 200. In a plan view, the first protrusions PT1 may be arranged in the edge area ER of the first chip 100. The first protrusion PT1 may be formed integrally with the first insulating layer 110. In other words, the first protrusions PT1 may be coupled to the first insulating layer 110 without boundaries therebetween. The first protrusions PT1 may be inserted into the second insulating layer 210 of the second chip 200.

The first recesses RC1 may be defined by the first insulating layer 110 of the first chip 100. The first bonding surface 111 of the first insulating layer 110 may be depressed in the fourth direction D4 to form the first recesses RC1. In two dimensions, the first recesses RC1 may be arranged in the edge area ER of the first chip 100.

For example, the first chip 100 may include four first protrusions PT1 and four first recesses RC1. Two first protrusions PT1 may be provided between two first recesses RC1 spaced apart from each other in the first direction D1. An area of a plane defined by coupling the four first protrusions PT1 may be larger than a planar area of the central region CR of the first chip 100.

The second chip 200 may include second protrusions PT2 and second recesses RC2.

The second protrusions PT2 may protrude from the second bonding surface 211 of the second insulating layer 210 of the second chip 200 in the fourth direction D4. The second protrusions PT2 may protrude from the second bonding surface 211 of the second insulating layer 210 toward the first insulating layer 110. In a plan view, the second protrusions PT2 may be arranged in the edge area ER of the second chip 200. The second protrusions PT2 may be formed integrally with the second insulating layer 210. In other words, the second protrusions PT2 may be coupled to the second insulating layer 210 without boundaries therebetween. The second protrusions PT2 may be inserted into the first recess RC1 of the first chip 100.

The second recesses RC2 may be defined by the second insulating layer 210 of the second chip 200. The second bonding surface 211 of the second insulating layer 210 may be recessed in the third direction D3 to form the second recess RC2. In two dimensions, the second recesses RC2 may be arranged in the edge area ER of the second chip 200. The first protrusion PT1 may be inserted into the second recess RC2 of the second chip 200.

For example, the second chip 200 may include four second protrusions PT2 and four second recesses RC2. Two second recesses RC2 may be provided between two second protrusions PT2 spaced apart from each other in the first direction D1. An area of a plane defined by coupling the four second protrusions PT2 may be larger than a planar area of the central region CR of the second chip 200.

Figure 4:
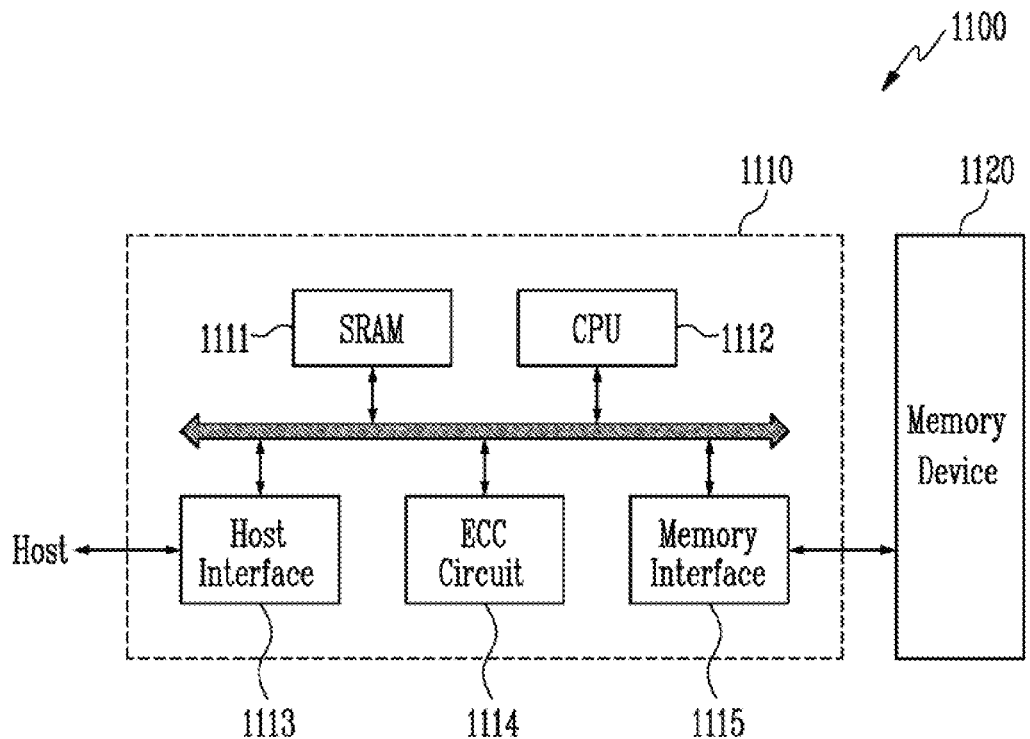
FIG. 4 is a block diagram illustrating the configuration of a memory system according to embodiment of the present disclosure.

FIG. 4 is a block diagram illustrating the configuration of a memory system 1100 according to embodiment of the present disclosure.

Referring to FIG. 4, the memory system 1100 may include a memory device 1120 and a memory controller 1110.

The memory device 1120 may include the structure described above with reference to FIGS. 1A to 1C, FIG. 2, or FIGS. 3A to 3C. The memory device 1120 may be a multi-chip package composed of a plurality of flash memory chips.

The memory controller 1110 may be configured to control the memory device 1120 and include a static random access memory (SRAM) 1111, a central processing unit (CPU) 1112, a host interface 1113, an error correction code (ECC) circuit 1114, and a memory interface 1115. The SRAM 1111 may serve as an operation memory of the CPU 1112, the CPU 1112 may perform a control operation for data exchange of the memory controller 1110, and the host interface 1113 may include a data exchange protocol of a host accessing the memory system 1100. In addition, the ECC circuit 1114 may detect and correct errors included in the data read from the memory device 1120, and the memory interface 1115 may perform interfacing with the memory device 1120. The memory controller 1110 may further include a read-only memory (ROM) that stores code data to interface with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer Small Interface (SCSI), Enhanced Small Disk Interface (ESDI), and Integrated Drive Electronics (IDE).

Figure 5:
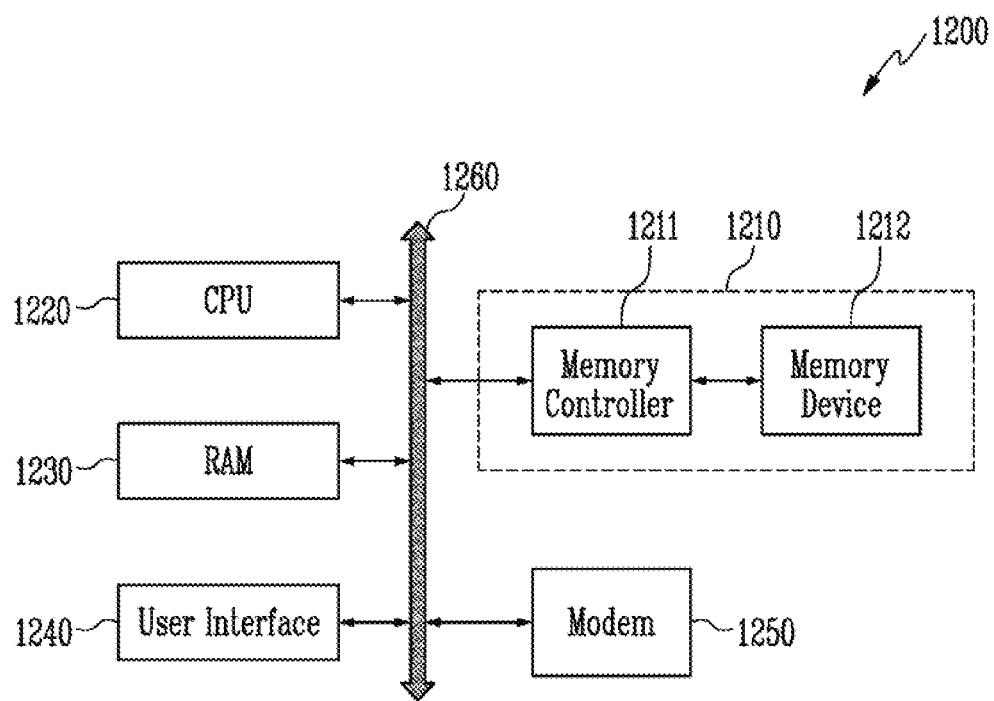
FIG. 5 is a block diagram illustrating the configuration of a computing system according to embodiment of the present disclosure.

FIG. 5 is a block diagram illustrating the configuration of a computing system 1200 according to embodiment of the present disclosure.

Referring to FIG. 5, the computing system 1200 may include a central processing unit (CPU) 1220, Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included.

As described above in connection with FIG. 4, the memory system 1210 may include a memory device 1212 and a memory controller 1211.

According to various embodiments of the present disclosure, in a semiconductor memory device, protrusions may be provided on bonding surfaces of first and second chips. Accordingly, bonding strength between the first chip and the second chip of the semiconductor memory device may be increased, and operational reliability of the semiconductor memory device may be improved.

It will be apparent to those skilled in the art that various modifications can be made to any of the above-described embodiments of the present teachings without departing from the spirit or scope of the present teachings. Thus, it is intended that the present teachings cover all such modifications provided they come within the scope of the appended claims and their equivalents.

What is claimed is:

1. A semiconductor memory device, comprising:
a first chip including a peripheral transistor and a first insulating layer; and
a second chip including a stacked structure and a second insulating layer,
wherein the stacked structure includes conductive patterns and insulating patterns alternately stacked with each other,
the first insulating layer includes a first bonding surface,
the second insulating layer includes a second bonding surface contacting the first bonding surface, and
the second chip further includes a protrusion protruding from the second bonding surface of the second insulating layer toward the first insulating layer.

2. The semiconductor memory device of claim 1, wherein the protrusion is integrally formed with the second insulating layer.

3. The semiconductor memory device of claim 1,
wherein the first chip includes a recess in the form of a depression in the first bonding surface of the first insulating layer, and
wherein the protrusion is configured to be inserted into the recess.

4. The semiconductor memory device of claim 1,
wherein the second chip further includes a first metal line exposed through the second bonding surface of the second insulating layer, and
wherein the first metal line contacts the first bonding surface of the first insulating layer.

5. The semiconductor memory device of claim 4, wherein the first metal line is electrically coupled to at least one of the conductive patterns.

6. The semiconductor memory device of claim 4,
wherein the first chip further includes a second metal line exposed through the first bonding surface of the first insulating layer, and
wherein the second metal line contacts the first metal line and the second bonding surface.

7. The semiconductor memory device of claim 6, wherein the second metal line is electrically coupled to the peripheral transistor.

8. The semiconductor memory device of claim 1, wherein the stacked structure is arranged in a central region of the second chip, and
wherein the protrusion is arranged in an edge region of the second chip, wherein the edge region surrounds the central region.

9. The semiconductor memory device of claim 1,
wherein the protrusion is one of a plurality of protrusions included in the second chip, and
wherein the stacked structure is arranged between the plurality of protrusions.

10. A semiconductor memory device, comprising:
a first chip including a peripheral transistor and a first insulating layer; and
a second chip including a stacked structure and a second insulating layer,
wherein the stacked structure includes conductive patterns and insulating patterns alternately stacked with each other,
the first insulating layer includes a first bonding surface,
the second insulating layer includes a second bonding surface contacting the first bonding surface, and
the first chip further includes a protrusion protruding from the first bonding surface of the first insulating layer toward the second insulating layer.

11. The semiconductor memory device of claim 10, wherein the protrusion is integrally formed with the first insulating layer.

12. The semiconductor memory device of claim 10,
wherein the second chip includes a recess in the form of a depression in the second bonding surface of the second insulating layer, and
wherein the protrusion is configured to be inserted into the recess.

13. A semiconductor memory device, comprising:
a first chip including a peripheral transistor and a first insulating layer; and
a second chip including a stacked structure and a second insulating layer,
wherein the stacked structure includes conductive patterns and insulating patterns alternately stacked with each other,
wherein the first insulating layer includes a first bonding surface,
wherein the second insulating layer includes a second bonding surface contacting the first bonding surface,
wherein the first chip further includes a first protrusion protruding from the first bonding surface of the first insulating layer toward the second insulating layer, and
wherein the second chip further includes a second protrusion protruding from the second bonding surface of the second insulating layer toward the first insulating layer.

14. The semiconductor memory device of claim 13,
wherein the first protrusion is integrally formed with the first insulating layer, and
wherein the second protrusion is integrally formed with the second insulating layer.

15. The semiconductor memory device of claim 13,
wherein the first chip includes a first recess in the form of a depression in the first bonding surface of the first insulating layer,
wherein the second protrusion is configured to be inserted into the first recess,
wherein the second chip includes a second recess in the form of a depression in the second bonding surface of the second insulating layer, and
wherein the first protrusion is configured to be inserted into the second recess.

16. The semiconductor memory device of claim 15,
wherein the peripheral transistor is arranged in a central region of the first chip,
wherein the stacked structure is arranged in a central region of the second chip,
wherein the first protrusion and the first recess are arranged in an edge region of the first chip, wherein the edge region of the first chip surrounds the central region of the first chip, and
wherein the second protrusion and the second recess are arranged in an edge region of the second chip, wherein the edge region of the second chip surrounds the central region of the second chip.

* * * * *